United States Patent
Narayanaswamy

(10) Patent No.: US 11,916,331 B2
(45) Date of Patent: Feb. 27, 2024

(54) RETAINING MODULE FOR CABLES

(71) Applicant: HEWLETT PACKARD ENTERPRISE DEVELOPMENT LP, Houston, TX (US)

(72) Inventor: Shivakumar Narayanaswamy, Bangalore (IN)

(73) Assignee: Hewlett Packard Enterprise Development LP, Spring, TX (US)

( * ) Notice: Subject to any disclaimer, the term of this patent is extended or adjusted under 35 U.S.C. 154(b) by 45 days.

(21) Appl. No.: 17/223,294

(22) Filed: Apr. 6, 2021

(65) Prior Publication Data
US 2022/0200198 A1    Jun. 23, 2022

(30) Foreign Application Priority Data
Dec. 21, 2020 (IN) .............................. 202041055653

(51) Int. Cl.
| | |
|---|---|
| H01R 31/06 | (2006.01) |
| H01R 13/60 | (2006.01) |
| H05K 7/14 | (2006.01) |
| G06F 1/18 | (2006.01) |
| H01R 13/46 | (2006.01) |

(52) U.S. Cl.
CPC ............ *H01R 13/60* (2013.01); *G06F 1/182* (2013.01); *H01R 13/465* (2013.01); *H05K 7/14* (2013.01); *H01R 2201/06* (2013.01)

(58) Field of Classification Search
CPC ........ H01R 36/04; H01R 23/25; H01R 31/06; H01R 13/447; H01R 13/5213; H01R 13/4543
USPC .................................................. 361/728
See application file for complete search history.

(56) References Cited

U.S. PATENT DOCUMENTS

| | | | |
|---|---|---|---|
| 3,783,371 A * | 1/1974 | McMillan ............ | G01R 19/145 |
| | | | 324/508 |
| 9,524,005 B2 | 12/2016 | Saez et al. | |
| 9,578,779 B2 | 2/2017 | Yi | |
| 9,698,529 B1 | 7/2017 | Schow et al. | |
| 10,566,746 B1 * | 2/2020 | Breeden ................ | H01R 24/78 |
| 2016/0050375 A1 * | 2/2016 | Soffer ....................... | G06F 3/14 |
| | | | 348/565 |
| 2016/0276815 A1 * | 9/2016 | Parlor, Sr. ............... | H02G 3/12 |

OTHER PUBLICATIONS

Thermoplastics—Physical Properties (Year: 2023).*
Check Point Software Technologies Ltd., "Rack Mounting Kit for Desktop Appliances Installation Guide," Rack Mounting Kit, 2018, https://dl3.checkpoint.com/paid/18/18f1c54a4ec6f1ad4f38f7640d25263a/CP_RackMountingKit_InstallationGuide.pdf?HashKey=1603822240_4af2bdf5abea0651d6febda2d113495c&xtn=.pdf.

(Continued)

*Primary Examiner* — Phuong Chi Thi Nguyen
(74) *Attorney, Agent, or Firm* — Hewlett Packard Enterprise Patent Department

(57) ABSTRACT

Examples of a retaining module for a signal transmission cable are described. In an example, the retaining module comprises a passive physical port. The passive physical port is to receive a connector terminal attached to an end of the signal transmission cable. The passive physical port has a first shape which corresponds to a shape of the active physical port, and is arranged in a first layout on the housing corresponding to a layout of the active physical port on the electronic device.

18 Claims, 5 Drawing Sheets

(56) References Cited

OTHER PUBLICATIONS

Cisco, "Cisco UCS C220 Server installation and Service Guide," Chapter: Maintaining the Server, Feb. 16, 2018, https://www.cisco.com/c/en/us/td/docs/unified_computing/ucs/c/hw/C220/install/C220/replace.html.
Joseph et al., CISCO CRS-1, 12000, 7600, and ASR1000 Router Architecture , in Deploying QoS for Cisco IP and Next Generation Networks, Jun. 25, 2009.

* cited by examiner

RETAINING MODULE FOR CABLES

BACKGROUND

An electronic device, such as a data communication device, computing device, or a storage device, may be connected to a plurality of signal transmission cables (referred to as cables). The electronic device may undergo periodic maintenance in order to ensure optimal performance. During a maintenance activity, the electronic device may be powered down and removed for servicing, replacement, or upgradation. Such a maintenance activity may involve removal or unplugging of the cables connected to the electronic device. The cables may be replaced or re-plugged into the electronic device once the maintenance activity has completed.

BRIEF DESCRIPTION OF FIGURES

Systems and/or methods, in accordance with examples of the present subject matter are now described, by way of example, and with reference to the accompanying figures, in which.

DETAILED DESCRIPTION

Figure 1:
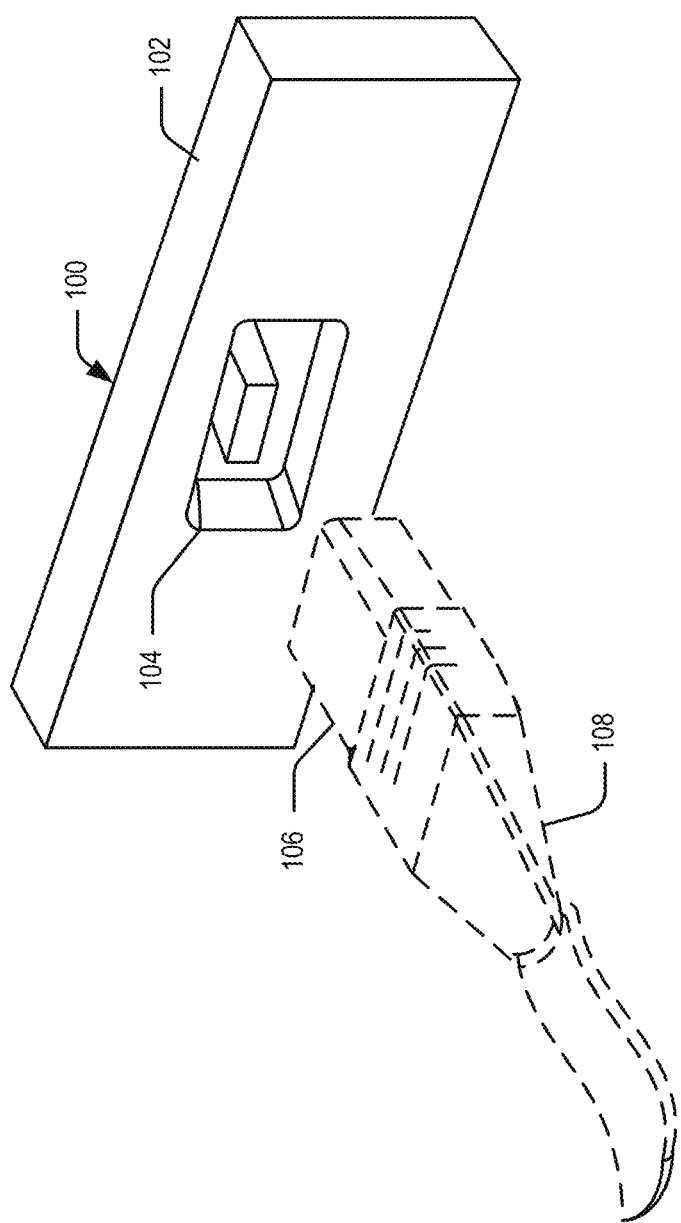
FIG. 1 illustrates a perspective view of a retaining module, as per an example.

Data organizations, such as data storage vendors, may perform maintenance of hardware resources to ensure optimal performance. Typically, an electronic device may be connected to a communication network or other electronic devices, via multiple signal transmission cables. Examples of a signal transmission cable includes, but is not limited to, Serial Attached Small Computer System Interface (SCSI) cable, Serial Attached SCSI (SAS) cable, Serial AT Attachment (SATA) cable, Fibre Channel, Internet SCSI (iSCSI) cable, remote copy connectivity cable, Universal Serial Bus (USB) cable, network cable, management cable, and console connectivity cable. An electronic device may include a computing device, a server, a computer networking device, a storage node, a storage controller, and a data communication device.

During a maintenance activity, the electronic device may be serviced, replaced with a new device of having same capacity, or replaced with a new device of different capacity. During such activities (which are referred to as maintenance activities), the cables connected to or plugged into the electronic device may have to be unplugged or removed. Once the maintenance activity is completed, the removed signal transmission cables (hereinafter referred to as cables) may then be plugged back into the appropriate port for resuming operation of the electronic device. The electronic device may be connected to different types of cables for implementing connections with different communication networks or electronic devices.

While the maintenance activity is underway, the cables may remain loose, and thus may hinder the maintenance activity. For instance, the cables may be rolled and bundled separately while the maintenance activity is being performed. Once the maintenance activities have been completed, the unplugged cables may be plugged back into the electronic device. To this end, a correct port into which any given cable is to be re-inserted, has to be determined. The cables may be labelled before unplugging to avoid misconnection, which will aid in determining the appropriate port to which the cables may be plugged back into. However, such manual labelling of each cable may have to be undertaken prior to the maintenance activity, may be laborious, time-consuming, and prone to human errors. The loose cables (even if labelled) may also be prone to entanglement among themselves or with other cables or equipment. For example, the cables may get trampled upon by servicing personnel performing the maintenance activity causing physical damage to the cables.

Examples of a retaining module for managing a signal transmission cable are described. The retaining module includes a housing and is provided with a passive physical port. The passive physical port is an electrically-inactive, i.e., non-conductive, or a dead port. In an example, the passive physical port is of a first shape which corresponds to a shape of an active physical port of an electronic device. In addition, the passive physical port may be in a first layout, such that its positioning on the retaining module corresponds to the positioning of the active physical port on the electronic device. In other words, the passive physical port may correspond to the active physical port in terms of shape, structure, size and layout.

In one example, the signal transmission cable may initially be connected to or plugged into the active port of the electronic device. The signal transmission cable may have a first end and a second end. The first end of the signal transmission cable may be provided with a connector terminal. The second end of the signal transmission cable may be connected to another device, say a network device, for example, a router, a modem, or a gateway device.

During a maintenance activity, the connector terminal of the signal transmission cable may be provisionally removed or unplugged from the active physical port on the electronic device. Subsequently, the connector terminal may be inserted or plugged into the passive physical port of the retaining module while the maintenance activity is being performed. While the maintenance activity is being performed, the connector terminal of the cable is retained within the passive physical port. Once the maintenance activity is completed, the connector terminal of the signal transmission cable is removed from the passive physical port and re-inserted into an active physical port. Since the connector terminals are secured in the corresponding passive physical port during maintenance, they are not exposed to any mishandling or damage while the maintenance activity is being performed. Since the first layout of the passive physical port is similar to the layout of the active physical port on the electronic device, labelling of the cable may not be performed to enable identification of the cable. Furthermore, since the passive physical port corresponds to the active physical port, the signal transmission cable may be accurately and easily replaced into the appropriate active physical port once the maintenance activity is completed. Furthermore, re-plugging the cable to the active physical port is fast, efficient, and less prone to misconnections.

In an example, the retaining module may be so manufactured such that different retaining modules may be used for different types of electronic devices. In an example, the retaining module may be in the form of smaller assemblable modules that may be assembled in an order which may conform to a layout of plurality of active physical ports on electronic devices. Such assemblable modules may be assembled to replicate or even approximately match the layout of a plurality active physical ports of an electronic device. These and such other examples are further described in conjunction with accompanying figures.

FIG. 1 illustrates a perspective view of a retaining module 100, as per an example. The retaining module 100 may be mountable onto a chassis (not shown in FIG. 1) of an electronic device (not shown in FIG. 1). For example, the retaining module 100 may be mounted onto a computer rack enclosing or holding the electronic device.

As illustrated in FIG. 1, the retaining module 100 includes a housing 102. The housing 102 forms an outer body for the retaining module 100. In one example, the housing 102 may have a cuboidal shape. Other example shapes are possible for the housing 102 without deviating from the scope of the subject matter of the claims.

In an example, the housing 102 may include a passive physical port 104. The passive physical port 104 may include a hollow receptacle, such as a socket. The passive physical port 104 is shaped to receive a complimentary-shaped connector terminal 106 present at a first end of a signal transmission cable 108 (both depicted in dotted line) during a maintenance activity of an electronic device (not shown in FIG. 1). The connector terminal 106 enables the cable 108 to be removably attached to the electronic device. The signal transmission cable 108 (hereinafter referred to as a cable 108) may be connected to another device or another connector terminal at its second end. The passive physical port 104 is a non-conductive port through which no active circuits may be formed. To such an end, the passive physical port 104 is not further connected to any conductive element or any internal circuitry, and thus, restricts conductive transmission of any carrier signals that may be present in the cable 108.

The passive physical port 104 is of a first shape which is similar to a shape of an active physical port of the electronic device. In addition, the passive physical port 104 may be in a first layout such that its position on the housing 102 corresponds to a positioning of the active physical port on the electronic device. Examples of an electronic device include, but are not limited to, a computing device, a server, a computer networking device, a storage device, and a storage controller.

During maintenance of the electronic device, the connector terminal 106 of the cable 108 may be provisionally removed from the active physical port of the electronic device. Once removed, the connector terminal 106 may be inserted or plugged within the passive physical port 104. While the maintenance is being performed, the connector terminal 106 (and thus the cable 108) are retained by the passive physical port 104 until the completion of the maintenance activity. Thereafter, the connector terminal 106 of the cable 108 may be removed from the passive physical port 104 and re-inserted into the appropriate active physical port that corresponds to the passive physical port 104. In an example, the retaining module 100 may be coupled, such as assembled, with another retaining device to emulate the layout of the active physical port on the electronic device. The another retaining device may have a size, shape, and layout similar to the first layout of the retaining module 100 or different from the first layout.

Figure 2:
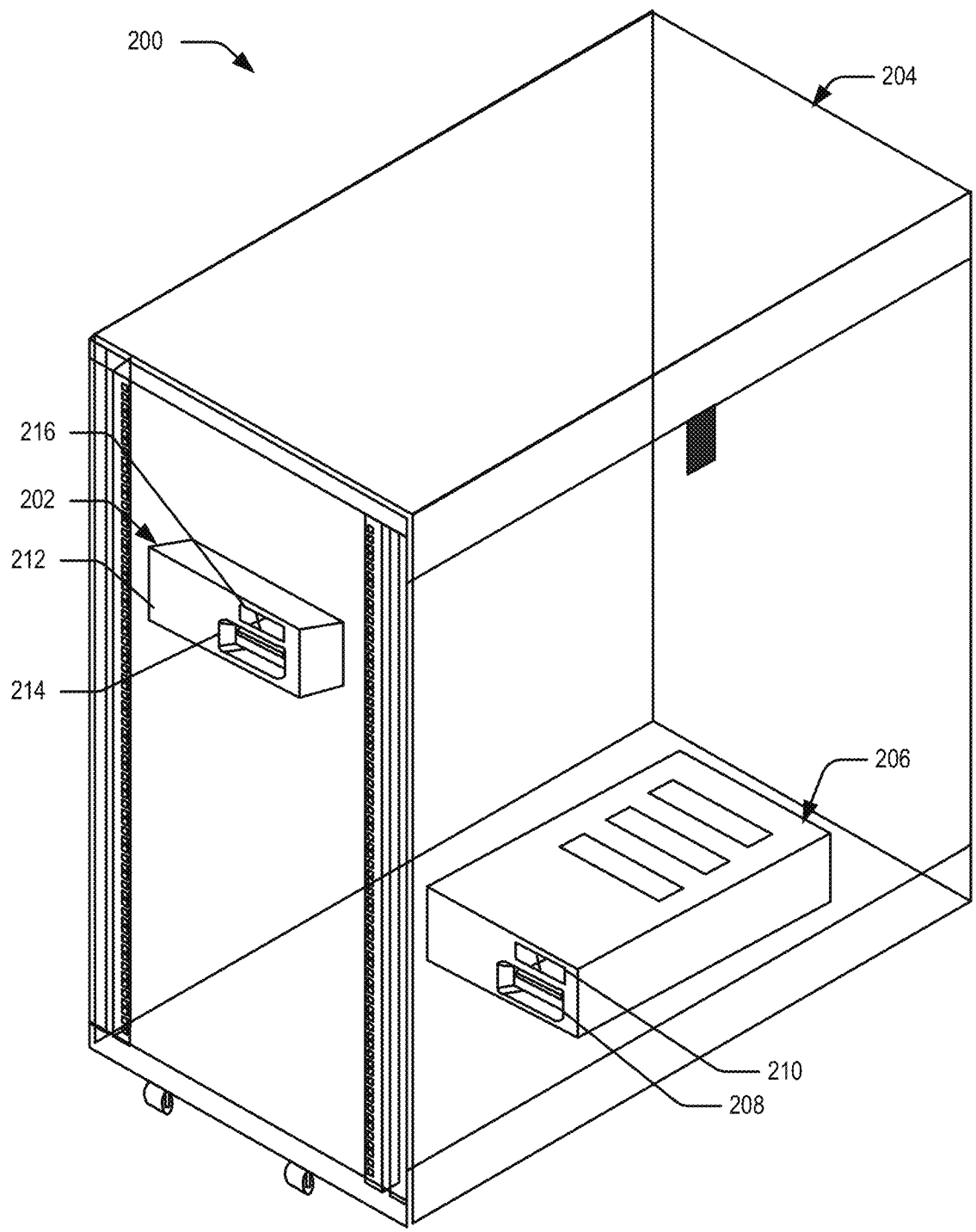
FIG. 2 illustrates a perspective view of a system comprising a retaining module, as per an example.

FIG. 2 illustrates a perspective view of a system 200 including a retaining module 202, as per an example. The system 200 includes a chassis 204 which is to house an electronic device 206 and the retaining module 202, as per another example. The system 200 as illustrated in FIG. 2 depicts an example system, which may be of any shape, size, or type without deviating from the scope of the present subject matter. Other examples may also be possible without deviating from the scope of the subject matter of the claims. In one example, the chassis 204 may include a number of rows and columns, wherein the electronic device 206 may by positioned at a particular location within the chassis 204. Moreover, the chassis 204 may be placed on a ground or mounted on a mounting surface, such as a wall.

In one example, the chassis 204 may house the electronic device 206 and provide support to the electronic device 206. For example, the chassis 204 may be a rack or other supporting means which may allow the electronic device 206 to be positioned horizontally. The shape and configuration of the rack as depicted may also vary, without deviating from the scope of the present subject matter. For example, the chassis 204 may be an open rack, such as a shelf, or closed rack, such as a cabinet. In an example, the chassis 204 may be assembled from assemblable units such that dimensions or configuration of the chassis 204 may be determined based on dimensions of the electronic device 206 which is to be accommodated therein. In some examples, the chassis 204 may further include other components, such as cooling fans, security equipment, and switches (not described for the sake of brevity of the application). In other examples, the electronic device 206 may be mounted on or in other locations of the chassis.

The electronic device 206 may control a flow of data signals between different components or other electronic devices. The electronic device 206 includes an active physical port 208. The active physical port 208 within the electronic device 206 may be electrically connected with a signal transmission cable (such as the signal transmission cable 108), and thus enables conductive transmission of carrier signals to and from the electronic device 206. In an example, the active physical port 208 is provided onto a back panel of the electronic device 206. However, such positioning of the active physical port 208 onto the back panel is only illustrative and should not be construed as limiting the claimed subject matter, in any way.

In one example, the active physical port 208 of the electronic device 206 is provided with an associated visual indicator 210. The visual indicator 210 corresponding to the active physical port 208 may visually indicate, for example, a type of the active physical port 208, such as HDMI port, SCSI port, iSCSI port, and SATA port. In another example, the visual indicator 210 may indicate a type of networking interface associated with the active physical port 208, such as Ethernet, LAN, and WAN, or in some instances, may indicate a type of signal associated with the active physical port 208, such as a power signal, audio signal, optical signal, and video signal. As depicted in FIG. 2, the visual indicator 210 may be in form of an inscription, such as a name 'X' on the electronic device 206 provided above the active physical port 208. Further, in other examples, the visual indicator 210 may have other objects thereon, such as a symbol, a character, an alphabet, a number, an icon, or a combination thereof.

The retaining module 202 is to retain a connector terminal (such as the connector terminal 106) of the signal transmission cable 108. In an example, the retaining module 202 may be mounted on the chassis 204 of the electronic device 206. In other examples, the retaining module 202 may be mounted on or in other locations of the chassis 204. Similar to the retaining module 100 (as depicted in FIG. 1) the retaining module 202 includes a housing 212. In contrast, the retaining module 202 includes a passive physical port 214 provided within the housing 212. The passive physical port 214 is a non-conductive port which restricts conductive transmission of carrier signals that may be present in the signal transmission cable 108. To this end, physical features, such as layout and shape, of the retaining module 202 provided with the passive physical port 214 is similar to physical features of the back panel of the electronic device 206 where the active physical port 208 is provided. In an example, the passive physical port 214 may be provided on the housing 212 as illustrated in FIG. 2. In another example, the passive physical port 214 may protrude from a surface of the housing 212.

In an example, the passive physical port 214 may have a first shape which corresponds to a shape of the active physical port 208 of the electronic device 206. The passive physical port 214 may have a first size which corresponds to a size of the active physical port 208 of the electronic device 206. In an example, the passive physical port 214 within the housing 212 may also include a first indentation or a first protuberance which corresponds to an indentation or protuberance within the active physical port 208 of the electronic device 206.

In addition, the passive physical port 214 is arranged in a first layout on the housing 212 which corresponds to a layout of the active physical port 208 on the electronic device 206. For example, a position and an orientation of the passive physical port 214 on the housing 212 may correspond to a position and an orientation of the active physical port 208 on the electronic device 206. Moreover, the passive physical port 214 arranged in the first layout on the retaining module 202 may have a first visual indicator 216. The first visual indicator 216 of the passive physical port 214 corresponds to the visual indicator 210 of the active physical port 208. In one example, the first visual indicator 216 for the passive physical port 214 may also be an inscription 'X' on the housing 212 provided above the passive physical port 214. Therefore, one or more physical features, such as size, shape, and design, as well as one or more configuration aspects, such as positioning, orientation, layout, and visual indicator, of the passive physical port 214 may be similar to physical features and configuration aspects of the active physical port 208 of the electronic device 206. Thus, the passive physical port 214 within the housing 212 may correspond to the active physical port 208 of the electronic device 206.

In operation, the active physical port 208 may enable continuous transmission of signals from the signal transmission cable 108 to the electronic device 206. For initiating maintenance of the electronic device 206, the connector terminal 106 of the signal transmission cable 108 may be removed or unplugged from the electronic device 206. Subsequently, the unplugged connector terminal 106 of the signal transmission cable 108 may be provisionally (e.g., temporarily for service or maintenance period) plugged into the passive physical port 214 within which the connector terminal 106 may be retained until the completion of the maintenance of the electronic device 206. Thereafter, the connector terminal 106 may be re-inserted into an appropriate active physical port having inscription 'X' that corresponds to the passive physical port 214.

Figure 3:
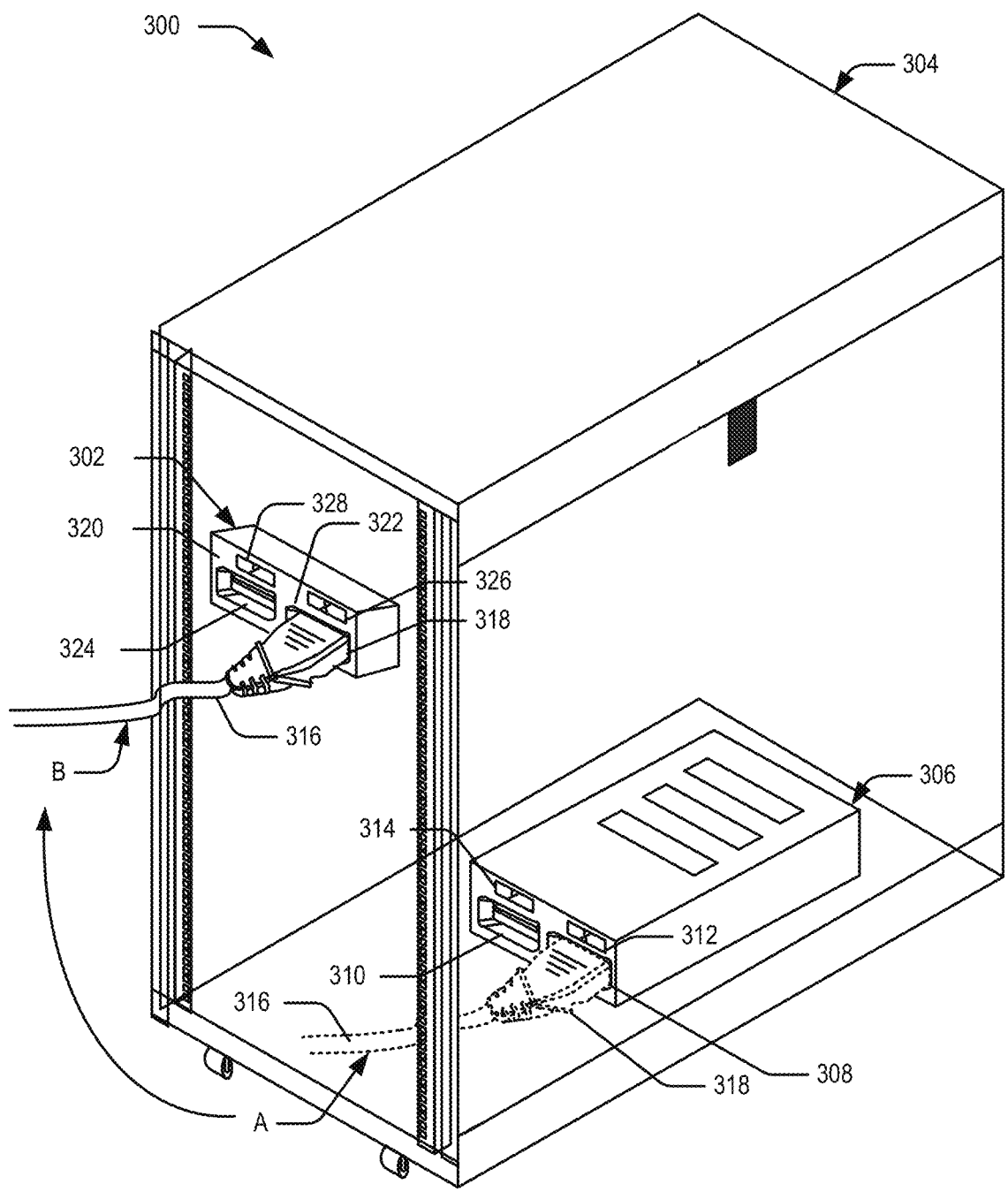
FIG. 3 illustrates a perspective view of a system comprising a retaining module, as per another example.

FIG. 3 illustrates a perspective view of a system 300 comprising a retaining module 302, as per another example. The system 300 (such as the system 200) includes a chassis 304 (such as the chassis 204) and an electronic device 306 (such as the electronic device 206) arranged within the chassis 304. The chassis 304 may provide an enclosure to the electronic device 306. In an example, the chassis 304 may be a rack, having a metallic frame.

In one example, the electronic device 306 may be a storage node controller within a data centre. Within the data centre, the storage node controller may be connected to other devices, such as storage nodes, other storage node controllers and network devices, for example, router, modem, switch, and gateway device. Such connection between the storage node controller and the other devices, may be facilitated by signal transmission cables (referred to as cables hereinafter). In an example, redundant paths may be established between the storage node controller and other devices, via multiple cables.

The electronic device 306 may further include a first active physical port 308 and a second active physical port 310. The first active physical port 308 and the second active physical port 310 (collectively referred to as active ports 308, 310) may be further connected to internal circuitry of the electronic device 306, which may process carrier signals received by the electronic device 306 or to be conveyed from the electronic device 306. Moreover, the conductive element of the active ports 308,310 enable exchange of carrier signals between the electronic device 306 the other devices. In the present example, a visual indicator 312 may be provided on a portion of the surface of the electronic device. The visual indicator 312 may be associated with the first active physical port 308, and to this end, may be provided in the vicinity of the active port 308. The electronic device 306 may further include another visual indicator 314 which may be associated with the second active physical port 310.

As depicted, the visual indicator 312 for the first active physical port 308 may be in form of an inscription, such as a name 'X' on the electronic device 306 provided above the first active physical port 308. Moreover, the visual indicator 314 for the second active physical port 310 may be in form of an inscription, such as a name Y on the electronic device 306 provided above the second active physical port 310. Such depiction of the electronic device 306 is only an example and should not be construed as limiting in any way. In other examples, the electronic device 306 may include more than two active physical ports. Further, the active physical ports may have associated visual indicators, wherein the visual indicators may be a label for the active physical ports of the electronic device 306, an inscription for the active physical ports, a colour code for the active physical ports, or a combination thereof. Examples of an active physical port includes, but are not limited to, a remote copy port, a management port, a fibre channel port, an Ethernet port, an audio/video interface port, an auxiliary (AUX) port, a high definition multimedia interface (HDMI) port, an Internet Small Computer System Interface (iSCSI) port, a Serial Attached SCSI (SAS) port, and cluster interconnect port.

The cable 316 may have a connector terminal 318 at a first end thereof. Further, a second end of the cable 316 may be connected to a network device (not shown in FIG. 3). In the present context, the cable 316 may be removably attached to or plugged within the first active physical port 308 of the electronic device 306. Further, the second active physical port 310 of the electronic device 306 may be in non-operative state, i.e., not connected to a cable.

Furthermore, the system 300 includes the retaining module 302. The retaining module 302 may include a mounting mechanism for mounting the retaining module 302 to a rigid surface. In one example, the retaining module 302 may have a magnetic element (not shown in FIG. 3), such as a magnetic strip. Further, the magnetic element of the retaining module 302 may be mounted onto the metallic frame of the chassis 304. It may be noted that mounting of the retaining module 302 onto the chassis 304 using the magnetic element is only exemplary. In other examples of the present subject matter, the retaining module 302 may be mounted onto the chassis using other mounting mechanism, such as hook, hanger, or mechanical fastener. Although the present example as depicted in FIG. 3 depicts only a single electronic device 306, the chassis 304 may be provided with a plurality of electronic devices. For example, a plurality of retaining modules corresponding to each of the plurality of electronic devices may be mounted onto the chassis 304.

The retaining module 302 includes a housing 320. The housing 320 may form an enclosure or a body of the retaining module 302. The housing 320 may be composed of a rigid non-conductive material. In one example, the housing 320 may be composed of a polymer material, such as high-density polyethylene (HDPE), polyvinyl chloride (PVC), expanded polystyrene (EPS) and expanded propylene (EPP).

The housing 320 is provided with a set of passive physical port (depicted as a first passive physical port 322 and a second passive physical port 324). The first passive physical port 322 and the second passive physical port 324 (collectively referred to as passive ports 322, 324) may be non-conductive or dead ports. In an example, a shape of the first passive physical port 322 is similar to a shape of the first active physical port 308. In a similar manner, a shape of the second passive physical port 324 is similar to a shape of the second active physical port 310. The passive ports 322, 324 have respective sizes which corresponds to a size of the corresponding active ports 308, 310. In addition, the passive ports 322, 324 have respective physical structures which corresponds to a physical structure of the corresponding active ports 308, 310. For example, the passive ports 322, 324 may have respective protrusions or indentations which corresponds to protrusions or indentations within the corresponding active ports 308, 310.

Continuing further, the passive ports 322, 324 are arranged as per a first layout within the housing 320. In an example, when arranged in the first layout, the positioning of the passive ports 322, 324 corresponds to or matches a layout, i.e., the positioning of the active ports 308, 310 on the electronic device 306. In an example, the passive ports 322, 324 arranged in the first layout are arranged such that they are horizontally aligned to each other. Such an alignment and positioning of the passive ports 322, 324 within the housing 320 is to match an alignment and positioning of the active ports 308, 310 on the electronic device 306, wherein the active ports 308, 310 are also horizontally arranged. For example, more than two active ports may be present on the electronic device 306, wherein the multiple active ports may be arranged in a certain sequence or order. In such an example, multiple passive physical ports may be provided within the housing 320, wherein a sequence or order of the multiple passive physical ports is to correspond to the sequence or order of the multiple active ports.

The first layout of the passive physical ports 322 and 324 on the housing 320 may include a visual indicator associated with each of the passive physical ports 322 and 324. To this end, a visual indicator 326 is provided for the first passive physical port 322, wherein the visual indicator 326 corresponds to the visual indicator 312 for the first active physical port 308. Moreover, a visual indicator 328 is provided for the second passive physical port 324, wherein the visual indicator 328 corresponds to the visual indicator 314 for the second active physical port 310. As depicted, the visual indicator 326 is an inscription 'X' while the visual indicator 328 is an inscription 'Y'.

Although not depicted, the first layout of the passive ports 322, 324 on the housing 320 may include a first colour code having a colour associated with each of the passive ports 322, 324. The first colour code of the passive ports 322, 324 may correspond to a colour code of the active ports 308, 310 of the electronic device 306. In one example, a first colour, say 'RED', may be associated with the first passive physical port 322 which corresponds to a matching 'RED' colour associated with the first active physical port 308. Additionally, a second colour, say 'YELLOW', may be associated with the second passive physical port 324 which corresponds to a matching 'YELLOW' colour associated with the second active physical port 310.

Returning back to the FIG. 3, a number of the passive ports 322, 324 matches a number of the active ports 308, 310. Moreover, the passive ports 322, 324 have a uniform shape. Since the passive ports 322, 324 corresponds to the active ports 308, 310, therefore, the passive ports 322, 324 are in shape of one of a remote copy port, a management port, a fibre channel port, an Ethernet port, an audio/video interface port, an auxiliary (AUX) port, a high definition multimedia interface (HDMI) port, an Internet Small Computer System Interface (iSCSI) port, a Serial Attached SCSI (SAS) port, and cluster interconnect port.

Prior to the maintenance activity, the connector terminal 318 may be plugged into the first active physical port 308 as indicated by a position A of the connector terminal 318 of the cable 316. During a maintenance activity, the connector terminal 318 of the cable 316 may be manually unplugged from the first active physical port 308. The unplugged connector terminal 318 of the cable 316 may be provisionally plugged into the first passive physical port 322 which corresponds to the first active physical port 308 as indicated by a position B of the connector terminal 318 of the cable 316. The first passive physical port 322 may retain the connector terminal 318 of the cable 316 until the completion of the maintenance activity. Once the maintenance activity has concluded, the connector terminal 318 may be unplugged from the passive physical port 322 and re-inserted into an appropriate active physical port, such as the active physical port 308 on the electronic device 306 having an inscription 'X'.

Figure 4:
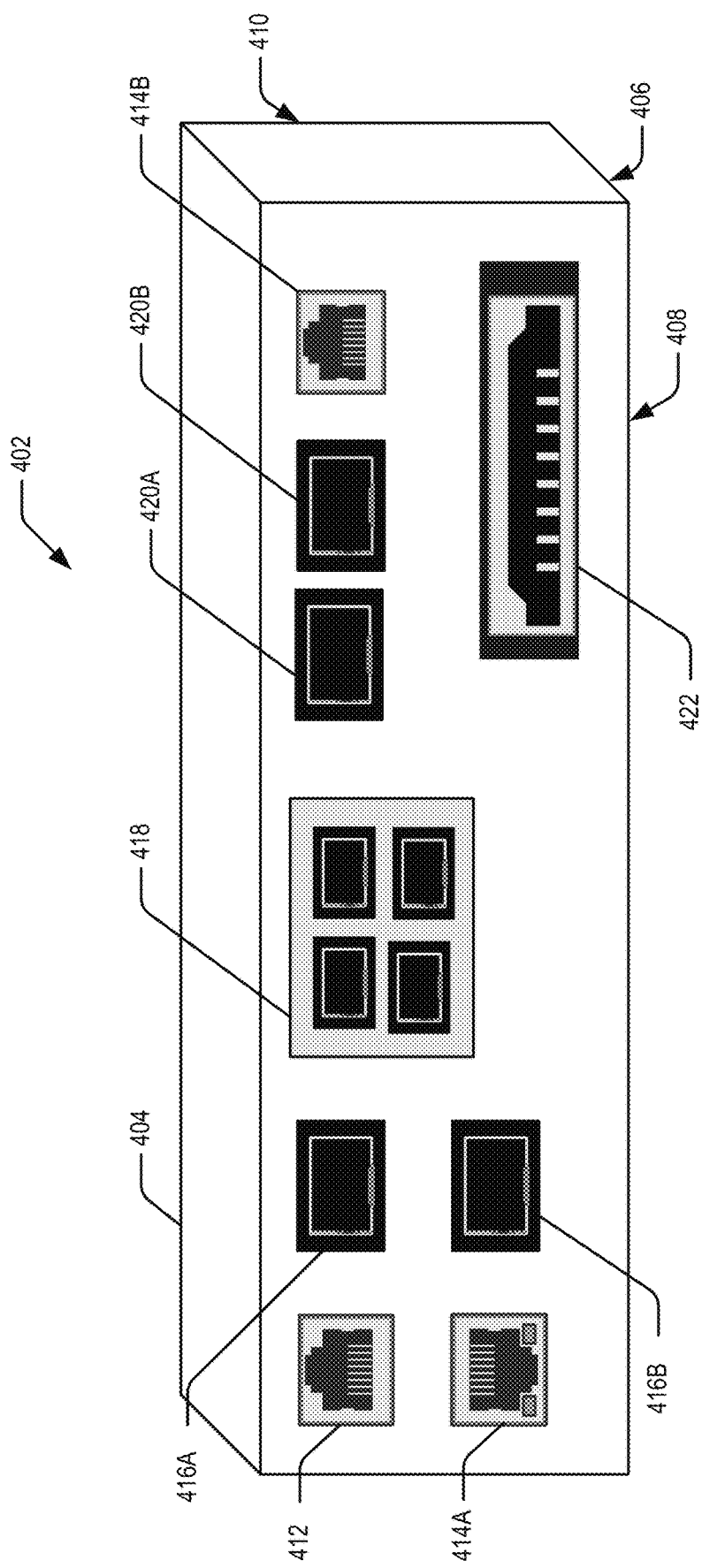
FIG. 4 illustrates a perspective view of a retaining module, as per an example.

FIG. 4 illustrates a perspective view of a retaining module 402, as per an example. In an example, the retaining module 402 may be manufactured such that it corresponds to a back panel of a conventionally available electronic device (not shown in FIG. 4). Examples of an electronic device may include, but is not limited to, a computing device, a processing device, a server, a computer networking device, a storage node, a storage controller, and a data communication device.

The retaining module 402 includes a housing 404 having a base portion 406. The base portion 406 further includes a pair of longitudinal edges and a pair of lateral edges. The pair of longitudinal edges may be parallel to each other. The pair of lateral edges may be parallel to each other and adjacent to the pair of longitudinal edges. The housing 404 may have a first longitudinal side 408 extending from a first longitudinal edge of the base portion 406. Moreover, the housing 404 may have a second longitudinal side 410 extending from a second longitudinal edge of the base portion 406. The second longitudinal side 410 may be opposite to the first longitudinal side 408. The housing 404 may further have a first lateral side extending from a first lateral edge of the base portion 406, a second lateral side extending from a second lateral edge of the base portion 406 and a top portion opposite to the base portion 406. In one example, the housing 404 may be composed of an insulator material. In one example, the housing 404 may be a rigid structure forming a cuboidal enclosure for the retaining module 402. In other examples, the housing 404 may be cubical, cylindrical, or prism.

The housing 404 includes a set of passive physical ports. In one example, the set of passive physical ports are provided on the first longitudinal side 408 of housing 404. The set of passive physical ports are non-conductive. As depicted in FIG. 4, the set of passive physical ports provided within the housing 404 includes a first passive physical port 412, a pair of second passive physical ports 414A and 414B, a pair of third passive physical ports 416A and 416B, a fourth passive physical port 418, a pair of fifth passive physical port 420A and 420B, and a sixth passive physical port 422. The number of the passive physical ports within the housing 404 corresponds to a number of active physical ports of the electronic device. In this regard, each of the passive physical ports within the housing 404 corresponds to a single active physical port of the electronic device.

In an example, a magnetic element (not shown in FIG. 4) may be provided on the second longitudinal side 410 of the housing 404. The magnetic element may enable mounting of the retaining module 402 onto a mounting surface, for example, a metallic surface. In one example, the retaining module 402 may be mounted onto a chassis, such as a rack, of the electronic device. In another example, the retaining module 402 may be mounted onto a mounting surface within the chassis of the electronic device. In yet another example, the retaining module 402 may be mounted onto a mounting surface not associated with the electronic device, which may be opposite or adjacent to the chassis associated with the electronic device.

Returning to the present example, the passive physical ports have respective shape which corresponds to shape of the corresponding active physical ports of the electronic device. For example, physical features, such as shape, size and structure, of the first passive physical port 412 within the housing 404 corresponds to physical features of a first active physical port (not shown in FIG. 4) of the electronic device. Similarly, physical features of other passive physical ports within the housing 404 is to correspond to corresponding active physical port of the electronic device.

Similar to the examples discussed in conjunction with the preceding figures, the set of passive physical ports are arranged in a first layout on the housing 404 corresponding to a layout of the set of active physical ports on the electronic device. In this regard, the passive physical ports have respective position and orientation which corresponds to position and orientation of the corresponding active physical ports of the electronic device.

The retaining module 402 may be in the form of assemblable modules (not shown in FIG. 4). Subsequently, the assemblable modules may be assembled in an order which may conform to the layout of the set of active physical ports on the electronic device. In one example, each of the assemblable modules may have fastening mechanisms, such as magnetic fastening, or mechanical fastening, for forming an assembled retaining module.

Figure 5:
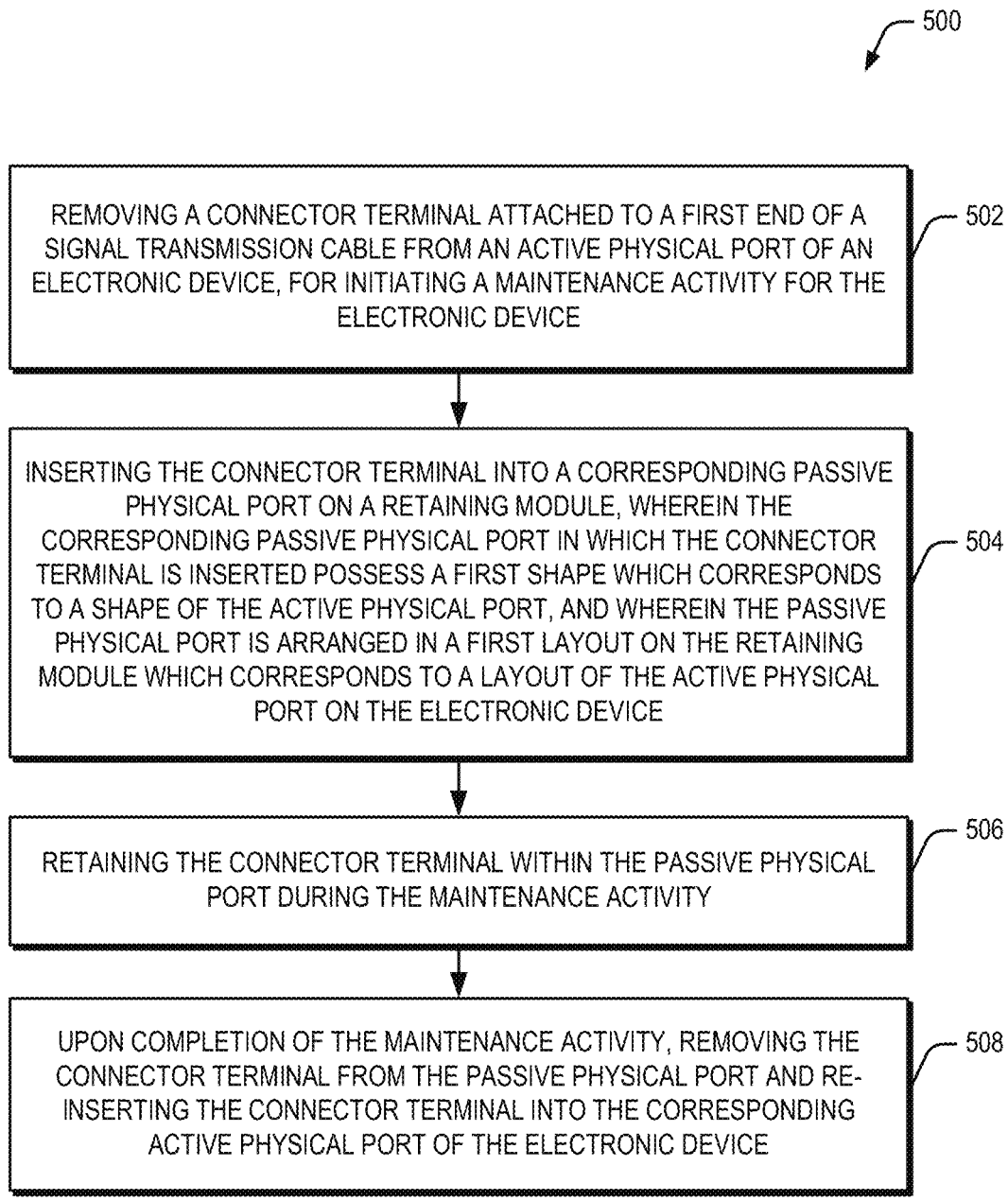
FIG. 5 illustrates a method for managing a set of signal transmission cables, as per an example.

FIG. 5 illustrates a method 500 for managing a signal transmission cable, as per an example. The order in which the method 500 is described is not intended to be construed as a limitation, and some of the described method blocks may be combined in a different order to implement the method, or alternative methods. Such a method may be performed separately at different instances without limiting the scope of the present subject matter in any manner.

Furthermore, the method 500 may be performed for initiating a maintenance activity for an electronic device (such as the electronic device 206). For example, the method 500 may be performed by a servicing personnel, such as a user, an engineer, or an IT personnel, in a data centre. To this end, the electronic device 06 may be a storage node controller, wherein the storage node controller may undergo a maintenance activity for data-in-place upgradation of the data centre. During the maintenance activity, the storage node controller may be serviced, replaced, or upgraded.

At step 502, a connector terminal may be removed from an active physical port of an electronic device. For example, the connector terminal 106 attached to a first end of the signal transmission cable 108 may be plugged into an active physical port 208 of the electronic device 206. A second end of the signal transmission cable 108 may be connected to another device, such as a storage node, a network device, a computing device, or a server.

In operation, the active physical port 208 enables flow of carrier signals therethrough, thereby enabling various communication functions between the electronic device 206 and the other device. In one example, the active physical port 208 may be provided at a back, such as a back panel, of the electronic device 206. In an example, the connector terminal 106 may be provisionally unplugged from the active physical port 208 of the electronic device 206 for performing any maintenance activity on the electronic device 206.

At step 504, the removed connector terminal may be inserted into a corresponding passive physical port on a retaining module. For example, the removed connector terminal 106 may be plugged into a passive physical port 214 of the retaining module 202. The retaining module 202 be mounted onto a chassis 204 of the electronic device 206, for example, onto a back side of the chassis 204 that corresponds to the back of the electronic device 206. The retaining module 202 may comprise a housing 212 and the passive physical port 214 provided within the housing 212. The passive physical port 214 may be an inactive or a dead port that restricts transmission of carrier signals therethrough. To this end, the retaining module 202 may be composed of a rigid insulator material, such as a polymer material. For example, the passive physical port 214 may be provided on the housing 212, i.e., the passive physical port 214 may extend beyond a surface of the housing 212.

The passive physical port 214 may have a first shape that conforms to a shape of the active physical port 208. Moreover, the passive physical port 214 may have a first size that conforms to a size of the active physical port 208. To this end, a cavity defined within the passive physical port 214 may be similar to a cavity defined within the active physical port 208 in terms of shape, size and structure. In addition, the passive physical port 214 is arranged in a first layout within the housing 212 of the retaining module 202 that conforms to a layout of the active physical port 208 on the electronic device 206. Subsequently, positioning, orientation, and visual indicator associated of the passive physical port 214 may be similar to positioning, orientation, and visual indicator associated of the active physical port 208.

At step 506, the connector terminal may be removed from the passive physical port after the completion of the maintenance activity. For example, after the maintenance activity, the serviced electronic device 206 or an upgraded electronic device may be placed back within the chassis 204 at an appropriate location. Thereafter, an active physical port of the electronic device 206 or the upgraded electronic device associated with the passive physical port 214 is determined. Subsequently, the connector terminal 106 may be re-inserted into the corresponding active physical port of the electronic device 206 or the upgraded electronic device.

The method 500 may be implemented iteratively for managing a set of signal transmission cables attached to a set of corresponding active physical ports of the electronic device. In an example, the retaining module may remain mounted onto the chassis after the re-insertion of the set of signal transmission cables into the set of corresponding active physical ports. In another example, the retaining module may be unmounted and stored separately for future use.

Although examples for the present disclosure have been described in language pertaining to structural features and/or methods, it should be understood that the appended claims are not necessarily limited to the certain features or methods described. Rather, the features and methods are disclosed and explained as examples of the present disclosure.

I claim:

1. A retaining module comprising:
a housing;
a plurality of passive physical ports that are not electrically connected to any circuitry in the retaining module; and
a plurality of first visual identifiers associated, respectively, with the plurality of passive physical ports such that each of the first visual identifiers uniquely identifies the associated passive physical port,
wherein the plurality of passive physical ports are configured to receive respective connector terminals attached to respective data signal transmission cables,
wherein the plurality of passive physical ports are associated respectively with a plurality of active physical ports on the electronic device such that each passive physical port has a shape corresponding to a shape of the associated active physical port and a position of each passive physical port relative to the other passive physical ports corresponds to a position of the associated active physical port relative to the other active physical ports,
wherein, for each of the passive physical ports, the first visual identifier associated with the respective passive physical port is the same as a second visual identifier on the electronic device which uniquely identifies the active physical port associated with the respective passive physical port.

2. The retaining module as claimed in claim 1, wherein each passive physical port has an orientation corresponding to an orientation of the associated active physical port.

3. The retaining module as claimed in claim 1, wherein each passive physical port has a size corresponding to a size of the associated active physical port.

4. The retaining module as claimed in claim 1, wherein the plurality of first visual identifiers comprises a plurality of colors arranged in a first color code, wherein the first color code corresponds to a second color code associated with the active physical ports of the electronic device.

5. The retaining module as claimed in claim 1, wherein the passive physical port is one of a remote copy port, management port, fibre channel port, Internet Small Computer System Interface (iSCSI) port, Serial Attached SCSI (SAS) port, and cluster interconnect port.

6. The retaining module as claimed in claim 1, wherein the passive physical port is provided within the housing.

7. The retaining module as claimed in claim 1, wherein the passive physical port is provided on the housing.

8. The retaining module as claimed in claim 1, further comprising a mounting mechanism to mount the retaining module onto a rigid surface.

9. The retaining module as claimed in claim 1, wherein each of the first visual indicators comprises any combination of one or more of: a symbol, a character, a number, an icon, a color, or a combination thereof.

10. The retaining module as claimed in claim 9, wherein the first visual indicator is an inscription provided adjacent to the passive physical port.

11. A system comprising:
a chassis;
an electronic device arranged within the chassis, wherein the electronic device comprises a set of active physical ports configured to removably receive a set of respectively corresponding connector terminals attached to associated signal transmission cables and communicably connect the signal transmission cables to the electronic device; and
a retaining module mountable onto the chassis, the retaining module comprising:
a housing;
a set of passive physical ports that are not electrically connected to any circuitry in the retaining module and are configured to receive the set of respectively corresponding connector terminals of the signal transmission cables; and
a set of first visual identifiers associated, respectively, with the passive physical ports such that each of the first visual identifiers uniquely identifies the associated passive physical port; and
a set of second visual identifiers associated, respectively, with the active physical ports such that each of the second visual identifiers uniquely identifies the associated active physical port,
wherein the passive physical ports are associated respectively with the active physical ports such that each passive physical port has a shape corresponding to a shape of the associated active physical port and a position of each passive physical port relative to the other passive physical ports corresponds to a position of the associated active physical port relative to the other active physical ports,
wherein, for each of the passive physical ports, the first visual identifier associated with the respective passive physical port is the same as the second visual identifier associated with the active physical port associated with the respective passive physical port.

12. The system as claimed in claim 11, wherein the set of active physical ports are on a back panel of the electronic device.

13. The system as claimed in claim 11, wherein the housing comprises
a base portion having a pair of longitudinal edges and a pair of lateral edges;
a first longitudinal side extending from a first longitudinal edge of the base portion, the first longitudinal side having the set of passive physical ports; and
a second longitudinal side extending from a second longitudinal edge of the base portion, opposite to the first longitudinal side, the second longitudinal side comprising a magnetic element to mount the retaining module onto the chassis.

14. The system as claimed in claim 11, wherein each of the first visual indicators and each of the second visual indicators comprises any combination of one or more of: a symbol, a character, a number, an icon, a color, or a combination thereof.

15. The system as claimed in claim 11, wherein a number of the passive physical ports matches a number of the active physical ports.

16. The system as claimed in claim 11, wherein the set of passive physical ports have a uniform shape.

17. A method comprising:
    removing a plurality of connector terminals attached to signal transmission cables, respectively, from a plurality of active physical ports of an electronic device, during a maintenance activity for the electronic device, each of the active physical ports having a shape, a relative position, and an associated visual identifier uniquely identifying the active physical port;
    inserting each of the connector terminals into a corresponding passive physical port on a retaining module that has a relative position, a shape, and an associated visual identifier which correspond to the relative position, the shape, and the visual identifier of the active physical port from which the respective connector terminal was removed, wherein each of the passive physical ports is not electrically coupled to any circuitry in the retaining module; and
    upon completion of the maintenance activity, removing each of the connector terminals from the passive physical ports and re-inserting each of the connector terminals into the corresponding active physical port of the electronic device.

18. The method as claimed in claim 17, wherein the signal transmission cable is one of Serial Attached Small Computer System Interface (SCSI) cable, Serial Attached SCSI (SAS) cable, serial ATA (SATA) cable, Fibre Channel, Internet SCSI (iSCSI) cable, Remote copy connectivity cable, USB cable, network cable, management cable, and console connectivity cable.

\* \* \* \* \*